United States Patent [19]

Nathanson et al.

[11] Patent Number: 5,355,095
[45] Date of Patent: Oct. 11, 1994

[54] BROADBAND MICROWAVE INTEGRATED CIRCUIT AMPLIFIER WITH CAPACITIVE NEUTRALIZATION

[75] Inventors: Harvey C. Nathanson, Pittsburgh; Richard J. Ravas, Penn Twp., Westmoreland County, both of Pa.

[73] Assignee: Westinghouse Electric Corp., Pittsburgh, Pa.

[21] Appl. No.: 838,971

[22] Filed: Feb. 21, 1992

[51] Int. Cl.$^5$ .............................................. H03F 3/18
[52] U.S. Cl. ...................... 330/264; 330/292; 330/307
[58] Field of Search ............ 330/264, 269, 277, 286, 330/292, 295, 307

[56] References Cited

U.S. PATENT DOCUMENTS 4,647,867  3/1987  Butler et al. ................. 330/292 X

*Primary Examiner*—Steven Mottola
*Attorney, Agent, or Firm*—R. Plenart

[57] ABSTRACT

Push-pull complimentary MOSFET devices are formed in a thin active layer between the top surface of a high resistivity silicon wafer and a insulating layer implanted below the top surface. Each MOSFET is composed of a plurality of cells each having a source, a gate, and a drain region extending fully through the active layer. Grooves extending through the wafer are lined with vias which connect the source regions with a floating ground plane on the bottom of the wafer. The gates of all the cells are connected by a gate bus on the top surface. Air bridges spanning the gates and the source vias connect the drain conductors of each cell. Neutralizing capacitors connected between an input and an opposite output of the push-pull complimentary MOSFET devices match the parasitic capacitances of the devices and provide wide bandwidth amplification with roll off well into the GHz range without the need for tuning inductors.

6 Claims, 4 Drawing Sheets

BROADBAND MICROWAVE INTEGRATED CIRCUIT AMPLIFIER WITH CAPACITIVE NEUTRALIZATION

BACKGROUND OF THE INVENTION

1. Field of the Invention

This invention relates to high frequency integrated circuit power amplifiers. More particularly, it relates to a push-pull power amplifier employing CMOS technology with capacitive neutralization in high resistivity silicon capable of operating linearly at frequencies in the gigahertz range.

2. Background Information

Bipolar transistors have been the successors to vacuum tubes in microwave amplification, until recently, when GaAs FET devices have received growing interest. Unfortunately, the GaAs FET exists only in N-type, precluding the circuit efficiencies attainable with complimentary devices. Silicon MOS devices are commonly available in CMOS, but with higher parasitic capacitance per transconductance than the GaAs devices. As a result, they have been ignored for high frequency applications.

Recently, a higher performance silicon technology has been developed in which the devices are formed in a thin active layer of silicon separated from high resistance silicon by an implanted insulating oxide layer. This configuration reduces the parasitic capacitance levels by an order of magnitude. Integrated circuits in accordance with this technology capable of operating in the gigahertz range are described in commonly owned U.S. patent application Ser. No. 07/583,059 filed Sep. 14, 1990 and entitled "Monolithic Microwave Integrated Circuit on High Resistivity Silicon".

Radio transmitters have long used push-pull vacuum tube power amplifiers with neutralizing capacitors to reduce the effects of parasitic capacitance, but they have also required inductive tuning. Such power amplifiers are very large and cannot operate in the gigahertz range.

There remains a need for a broadband integrated circuit power amplifier capable of operating in the gigahertz range.

There is a further need for such an integrated circuit power amplifier having high efficiency.

There is a related need for such an integrated circuit which can be implemented in CMOS technology in silicon.

There is also a need for such an integrated circuit power amplifier which can operate in the gigahertz range without the need for inductive tuning.

SUMMARY OF THE INVENTION

These and other needs are satisfied by the invention which is directed to a microwave power amplifier implemented in a wafer of high resistance silicon having a thin active layer of silicon between the top surface of the wafer and an implanted insulating oxide layer. The amplifier includes a pair of amplifier devices formed in the active layer and connected in push-pull configuration between pairs of inputs and outputs with neutralizing capacitors, each with a capacitance approximating the parasitic capacitance of one of the amplifier devices, connected between a separate one of the inputs and the opposite output. Preferably each of the amplifier devices is a complimentary MOSFET device. The insulating layer between the active layer and the high resistance silicon of the wafer greatly reduces the parasitic capacitance of the CMOS devices formed in the active layer which can be neutralized by capacitors alone for operation in the gigahertz range without the need for expensive and bulky tuning inductances. It also produces a very broadband amplifier with roll-off well up into the gigahertz range of frequencies.

As another aspect of the invention, the MOSFET devices include four adjacent regions extending through the active layer of a semiconductor wafer between the top surface and an insulating layer. The first region is heavily doped with a first type of impurity, the second is heavily doped with the opposite type of impurity, the third is lightly doped with the first type impurity and the fourth, like the first, is heavily doped with the first type of impurity. A groove extends from the bottom surface of the wafer through high resistance semiconductor material making up the bulk of the wafer, through the insulating layer and exposes at least a portion of the first region of the active layer. A plated via lines the groove and is in electrical contact with the first region which forms the source of the MOSFET device.

The second and third regions which form the gate, are covered with a gate insulating layer on top of which is a gate electrode. A plated conductor electrically contacts the fourth region in the active layer which forms the drain. Numerous cells, each containing the four described regions, are formed adjacent one another in the active region. Each of the first regions is electrically contacted by a via lining a groove formed in the bottom surface of the wafer with all of the first vias connected together along the bottom surface. Likewise, the gate electrodes spaced from the second and third regions of each cell by a gate insulating layer are connected together. A conductor contacting the fourth regions of all of the cells forms air bridges spanning the gate electrodes and first regions. Preferably, the order of the four regions in adjacent cells is reversed so that adjacent cells alternately share a common via or air bridge conductor. Also, preferably, the semiconductor material is silicon and two sets of cells having opposite doping are formed in the active layer of the wafer to form complimentary P and N channel MOSFET devices

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
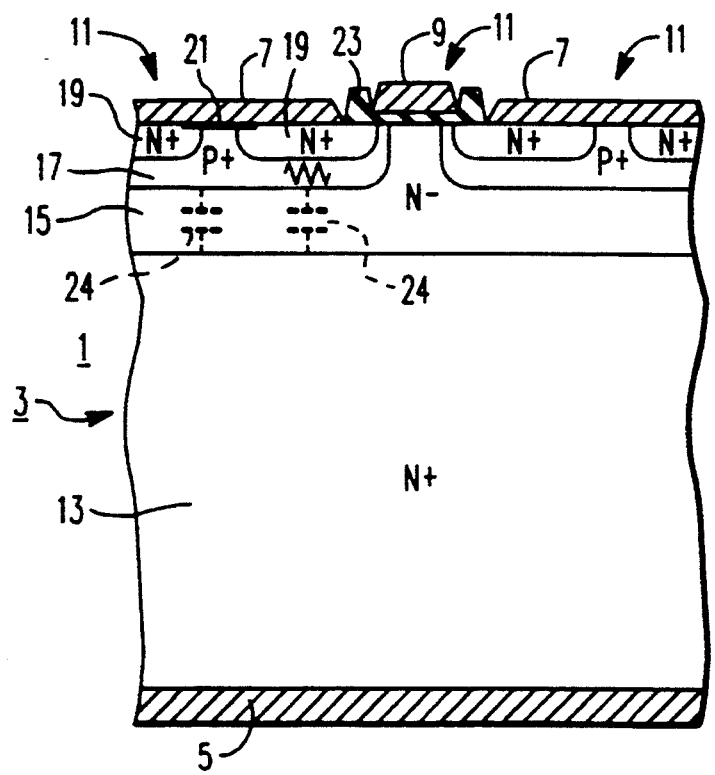
FIG. 1 is a vertical section view through a conventional CMOS silicon power amplifier of the prior art.

Before describing the invention, it is useful to understand the presently available CMOS power amplifier. An example of a CMOS silicon power amplifier 1 is shown in FIG. 1. This amplifier 1 is a vertical device formed in a wafer 3 of silicon which includes a drain electrode 5 plated on the bottom surface of the wafer, and source electrodes 7 spaced apart by insulated gate electrodes 9 on the top surface of the wafer. The device 1 shown has multiple cells sharing alternate source and insulated gate electrodes. Each cell 11 includes a substrate 13 heavily doped with N-type impurities in the lower part of the wafer 3. The upper portion 15 of the wafer 3 is lightly doped with N-type impurities. P-type impurities are implanted in region 17 in the N-layer 15 to form P+ regions. Heavily doped N+ regions 19 are then implanted in the P+ region 17. The source electrodes 7 are plated over the N+ regions and the P+ regions are grounded to the source electrode 7 through a contact layer 21.

A gate insulating oxide layer 23 is formed over the N− region 15, the narrow ends of the P+ regions 17 and the edges of the N+ region 19. The electrode 9 is then formed over the gate insulating layer.

With no voltage applied to the gate electrode 9, the junctions formed between the P+ region 17 and the N+ region 19 and N− region 15 block flow of current between the source electrode 7 and the drain electrode 5. When a positive voltage is applied to the gate electrode 9, the P+ region 17 is inverted by the attraction of electrons which form an N-channel through which current flows through the device. In the device 1 shown, each gate electrode 9 controls the flow of current through two adjacent cells 11.

Generally, the devices 1 are operated only up to about 800 MHz due to excessive stray capacitance and inductance. There is a large amount of the parasitic capacitance 24 between the source and drain. Additional capacitance is attributable to the leads between the gates and sources which are metal plated over oxides. The frequency response of the device 1 is also limited by the fact that the P+ region 17 must be grounded, but due to the configuration of this structure, this P+ region 17 is only grounded by the contact layer 21 between the N+ regions 19. The resistance of this P+ region 17 in combination with the source to drain capacitance limits the frequency response of the device. Because of these limitations, silicon MOS devices have been ignored for high frequency applications.

The broadband microwave power amplifier of the invention and the MOSFET devices utilized therein are implemented using MICROX (an unregistered trademark of Westinghouse Electric Corporation) technology. MICROX technology includes techniques for manufacturing integrated circuits on a wafer of high resistivity silicon. This technology is described in commonly owned U.S. patent application Ser. No. 07/583,059 filed Sep. 14, 1990 and entitled "Monolithic Microwave Integrated Circuit on High Resistivity Silicon" which is hereby incorporated by reference as appendix A hereto.

Figure 2:
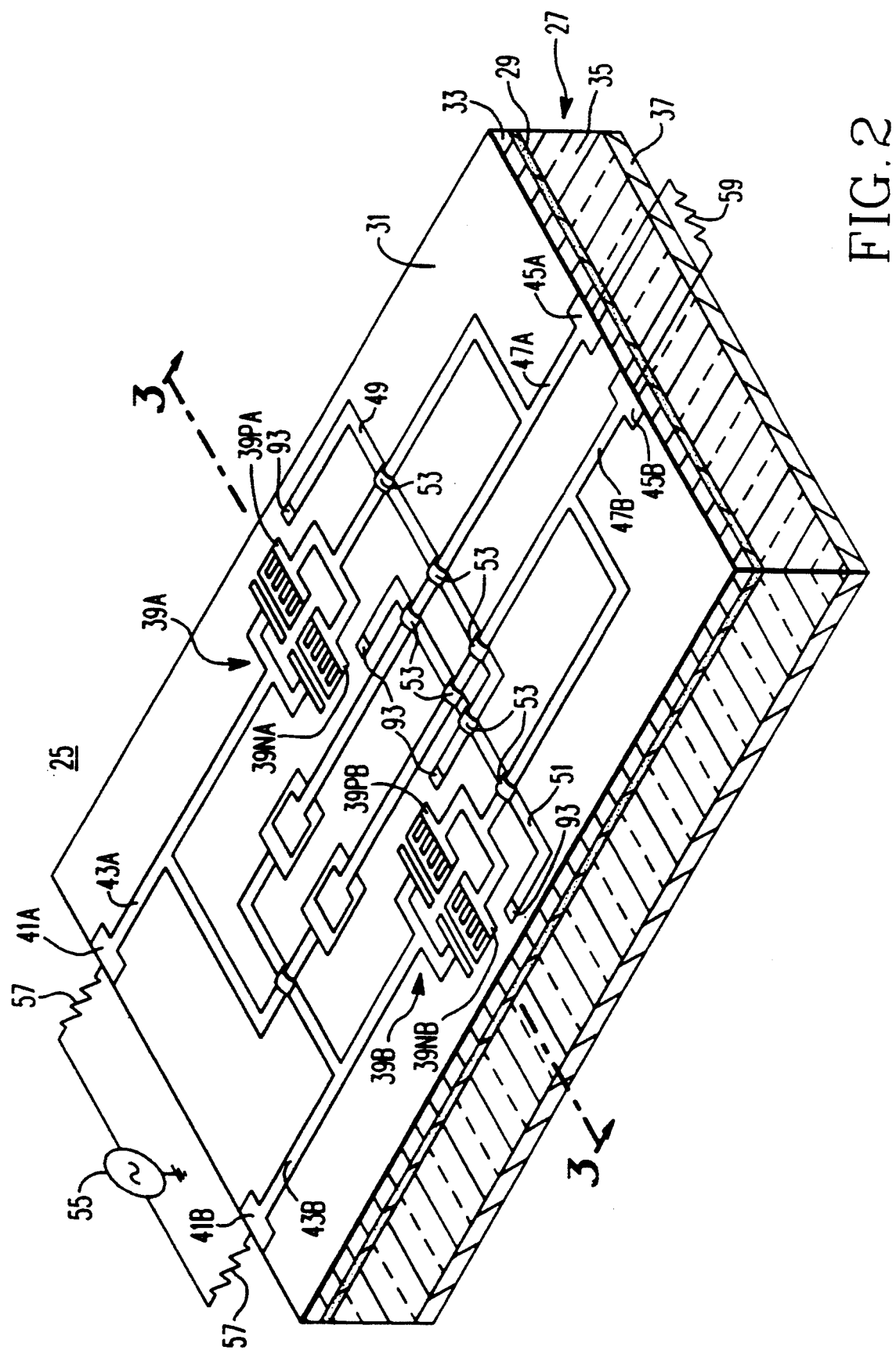
FIG. 2 is an isometric view of a microwave amplifier implemented as an integrated circuit in accordance with the invention with external components shown schematically.
Figure 3:
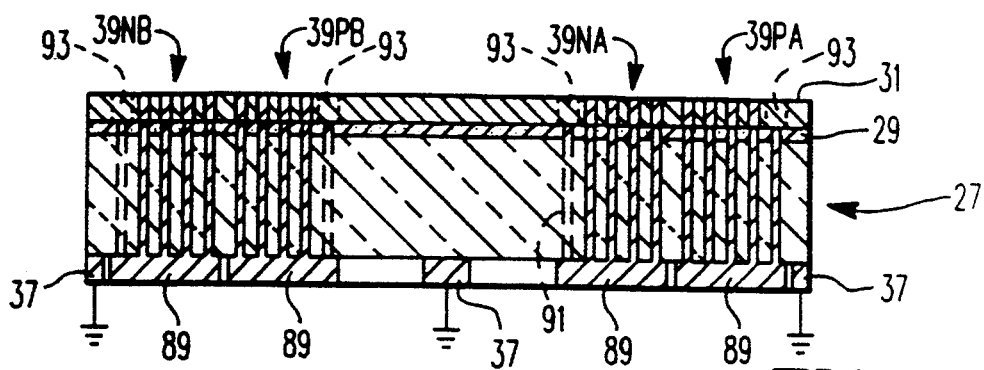
FIG. 3 is a vertical section through a portion of FIG. 2.

Referring to FIGS. 2 and 3, the microwave amplifier 25 is implemented as an integrated circuit on a wafer 27 of high resistivity silicon. The wafer 27 has a resistivity of at least about 1000 ohm cm, and preferably above about 5000 ohm cm.

An insulating oxide layer 29 is implanted below the upper surface 31 of the wafer 27. The process of implanting the oxide layer causes the thin layer 33 of the wafer between the oxide layer 29 and the upper surface 31 to revert to active, device-quality silicon. In the exemplary device 25, the active silicon layer 33 and the oxide layer 29 are each about 1000 angstroms thick, while the high resistivity substrate 35 below the oxide layer 29 is about 100 microns thick. A conducting ground plane 37 is plated on the bottom surface of the wafer 27.

A pair of complimentary (CMOS) amplifier devices, 39A and 39B are formed in the active layer 33 of the silicon wafer 27 in a manner to be discussed in detail below. Each amplifier device 39A and 39B comprises a PFET and a complimentary NFET. Thus, the device 39A includes the P-channel FET 39PA and the N-channel FET 39NA, while P-channel and N-channel FETs 39PB and 39NB, respectively, form the device 39B. The CMOS amplifier devices 39A and 39B are connected in push-pull arrangement between a pair of input terminals 41A and 41B by microstrips 43A and 43B, respectively, and a pair of output terminals 45A and 45B by microstrips 47A and 47B, respectively.

Figure 4:
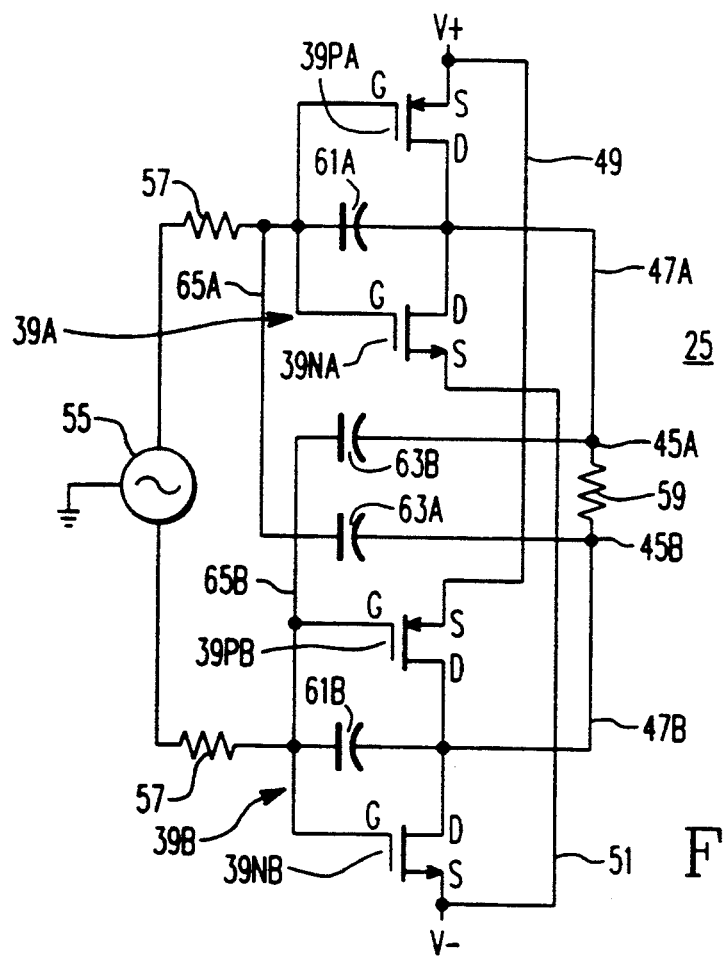
FIG. 4 is a schematic circuit diagram of the microwave amplifier of FIG. 2.

As best seen in the schematic circuit diagram of FIG. 4, the drain electrodes D of the P-channel and N-channel FETs of the CMOS amplifier 39A are connected together and to terminal 45A by the microstrip 47A. Similarly, the microstrip 47B connects the drain electrodes of devices 39PB and 39NB together to the output terminal 45B. The source electrodes S in the P-channel FETS in the devices 39A and 39B are connected together to a positive supply voltage V+ by a microstrip 49, while the source electrodes of the N-channel FETs are connected to a negative supply voltage V− by a microstrip 51. Returning to FIG. 2, crossovers 53 formed by thin oxide layers isolate the microstrips from each other where they overlap.

The microwave amplifier 25 is driven by an oscillator 55 having internal resistances 57 connected across the input terminals 41A, 41B. A load 59 is connected across the output terminals 45A, 45B. In accordance with the invention, the oscillator 55 operates in the GHz range. At these frequencies, the devices 39A and 39B have parasitic capacitance 61A and 61B (see FIG. 4).

While this parasitic capacitance in the devices in accordance with the invention is much less than that in the prior art CMOS silicon power amplifier, it limits the high frequency performance of the amplifier 25. Accordingly, a neutralization capacitor 63A is formed on the active layer 33 and connected by microstrip 65A between the gates G of device 39A and the second output terminal 45B. A second neutralization capacitor 63B is connected by microstrip 65B between the gates G of device 39B and the first output terminal 45A. The neutralization capacitors 63A, 63B are formed by metalization layers separated by an oxide layer. The capacitances of capacitors 63A and 65B are selected to match the parasitic capacitances 61A, 61B, respectively. The current in the neutralization capacitors is 180° out of phase with the current caused by the parasitic capacitance of the devices, and being substantially equal thereto, as the neutralization capacitors are selected to equal the parasitic capacitance, it offsets the effect of the parasitic capacitance.

Figure 5:
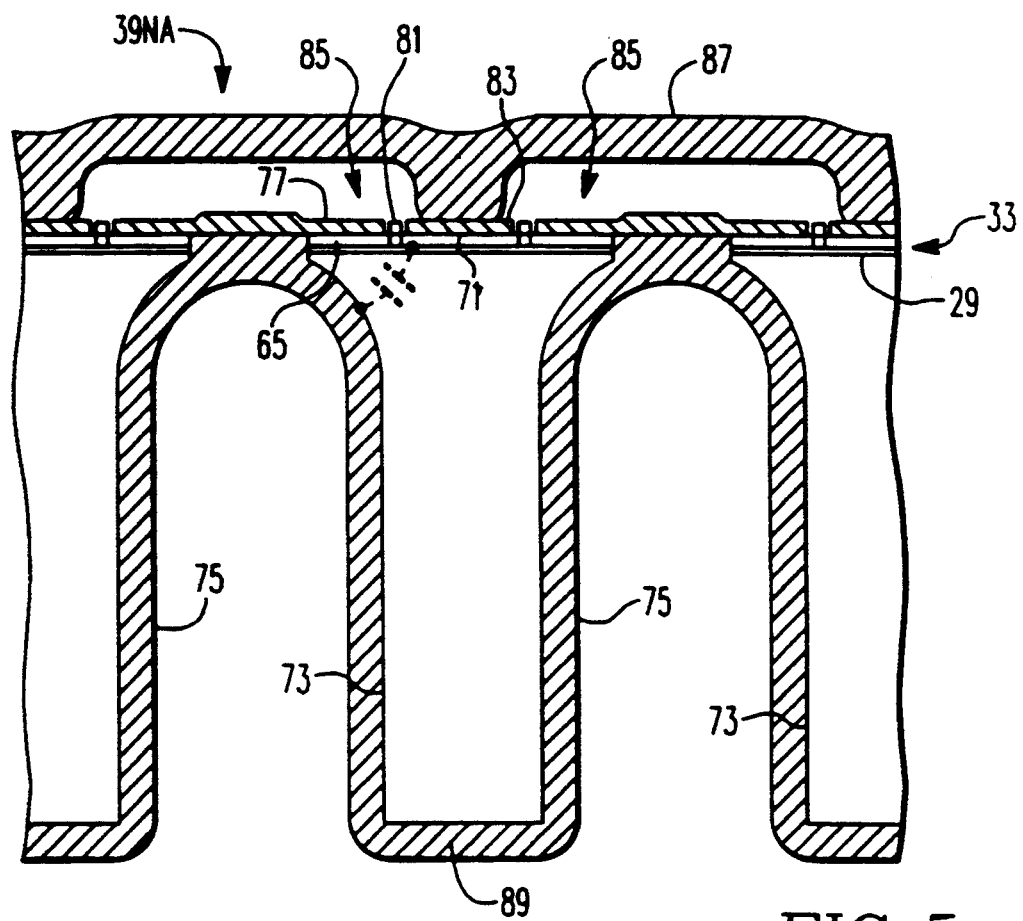
FIG. 5 is a portion of FIG. 3 in enlarged scale.
Figure 6:
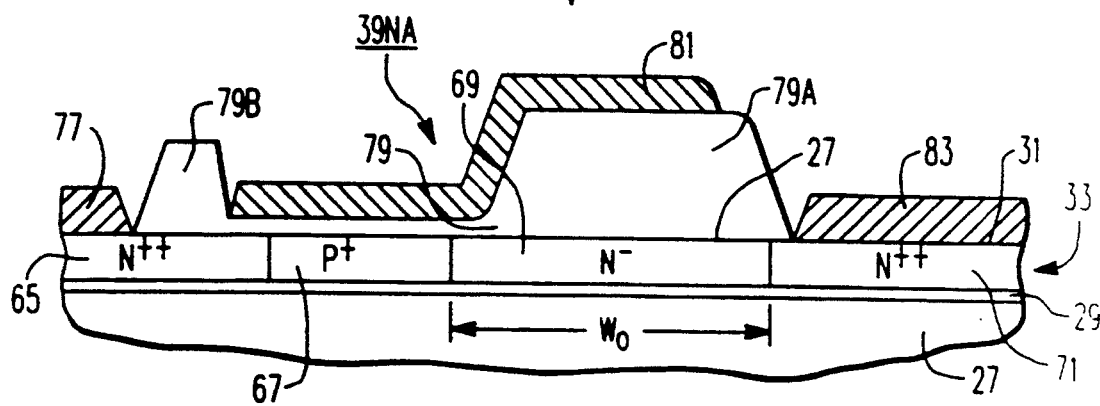
FIG. 6 is an enlargement of the circled section of FIG. 5.

FIG. 5 illustrates a vertical section through a portion of the microwave amplifier integrated circuit 25 incorporating one of the N-channel FETs 39 NA or 39 NB. FIG. 6 is an enlargement of the circled portion of FIG. 5 which illustrates more clearly the construction of the FET. The FET 39 NA is formed in the active layer 33 above the oxide layer 29. A first region 65 is heavily doped with n-type impurities. Next to the region 65 is a second region 67 which is doped with P-type impurities. This is followed by a region 69 doped lightly with n-type impurities and then a region 71 heavily doped again with n-type impurities. These regions 65, 67, 69, 71 all extend fully through the active layer 33 from the upper surface 31 to the oxide layer 29. The region 65 is the source of the FET 39 NA.

A groove 73 extends from the bottom of the silicon wafer 27 up through the oxide layer adjacent the remote end of the region 65 as best seen in FIG. 5. The groove 73 is lined with a conducting via 75. An extension 77 of the via extends along the top surface of the source region 65 substantially its full length. A gate insulating layer 79 extends over the P+ region 67 and N− region 69, and past the junction between the regions between 65 and 67 over a portion of the source region 65. The gate insulating layer also extends slightly beyond the junction between the regions 69 and 71. A gate electrode 81 is plated over the gate insulating layer 79. The portion 79A of the gate insulating layer at the drain end is thicker than at the source end to withstand the stand-off of the drain voltage. A raised portion 79B of the gate insulating layer provides isolation between the source via 77 and the gate electrode 81.

A drain electrode 83 is applied over the drain region 71. As will be appreciated from FIG. 2, the regions 65, 67, 69 and 71 extend along the active layer 33 in the direction into the planes of FIGS. 3, 5 and 6. The regions 65, 67, 69 and 71 form a cell 85 and multiple cells 85 are formed adjacent one another as indicated by FIG. 5. Adjacent cells 85 are mirror images of each other sharing common source vias 75, 77 and common drain electrodes 83. The drain electrodes of adjacent pairs of cells 85 are joined by air bridges 87. The source electrodes are all tied together by the vias 73 through a floating ground plane 89.

In the device 39 NA, the junctions at the interfaces between the regions 65–67 and 67–69 prevent flow of current with no voltage applied to the gate electrode 81. With a positive voltage applied to the gate, an N-channel is formed in the P+ region 67 and current flows. The N− region 69 moves the junction with the P+ region away from the drain thereby increasing the breakdown voltage of the device.

As can be seen in FIG. 3, the floating ground plane 89 for the FET 39NA is connected to a via 91 which extends up through the wafer 27 to a contact 93 connected to the micro strip 51 on the top surface 27 which is connected through another top contact 93 (see FIG. 2), of the 39 NB FET.

The detailed construction of the FET 39 NB is the same of that described above in connection with 39 NA. The construction of the FETs 39PA and 39PB differ from those of 39NA only in that the first and fourth regions 65 and 71 would be heavily doped with P-type impurities while the corresponding second region 67 would be doped with N-type impurities and the region 69 would be doped with P-type impurities. These P-channel devices also have the source electrodes connected through vias 73 and a floating ground plane 89, and a via 91 to top contacts 93 which are interconnected by the microstrip 49. Remaining portions of the ground plane 37 are grounded.

In designing FET devices in accordance with the invention, the length $W_0$ of the region 69 determines the breakdown voltage of the device. As an example, for a device with a breakdown voltage $V_{BD}$ of 50 volts, and a critical breakdown field $E_{BD}$ of $2.5 \times 10^5$ v/cm, the length of this region is:

$$W_o = \frac{2 \times V_{BD}}{E_{BD}} = 4 \text{ Microns}$$

That such a device could operate above one gigahertz, consider that the rise time is as follows:

$$\tau_{Rise} = \tfrac{1}{2}\pi f_{Max} = 1.59 \times 10^{-10} \text{ sec for 1.5 GHz Operation}$$

at the same time the transit time across the region 69 is as follows:

$$\tau_{Transit} = w_o/v_{sat} = 4 \times 10^{-4}/5 \times 10^6 = 0.8 \times 10^{-10} \text{sec}$$

Thus, the transit time is much less than the rise time and the device is capable of blocking 50 volts while operating at 1.5 GHz.

Figure 7:
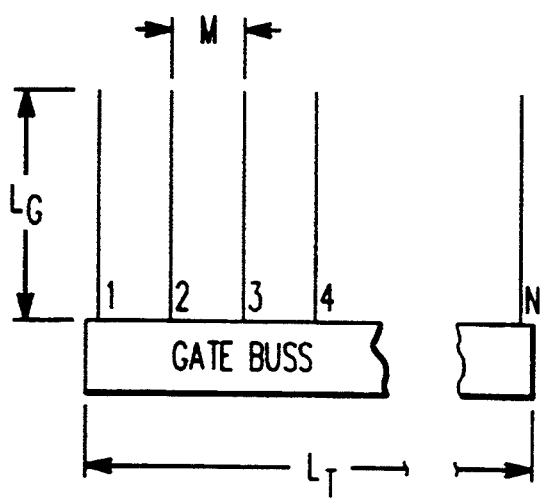
FIG. 7 schematically illustrates the gate bus arrangement for the microwave amplifier of FIG. 2.

As another example, consider such a MOSFET design to operate at 50 amps and 50 volts. Referring to FIG. 7, it will be seen that there are N gates 81 connected at one end by a gate bus 99. Consider further that the gates are M microns apart so that the total length $L_t$ is $(n-1)M$. Assume further, that the length $L_g$ of the gates is 200 microns, and that the transconductance gm of the gates is 100 mmhos/mm and that the maximum gate voltage is 5 volts. Under these conditions, the max current, $I_{max}$ is:

$$I_{max} \approx g_m V_{Gate\ Max} = 0.5 \text{ Amps/mm}$$

For a device capable of operating at 50 amps, 100 gates each 200 microns long are required. With a spacing of 50 microns between gates, and with each gate applied to adjacent cells, the total length $L_t$ of the gate bus is approximately 0.25 cm.

Figure 8:
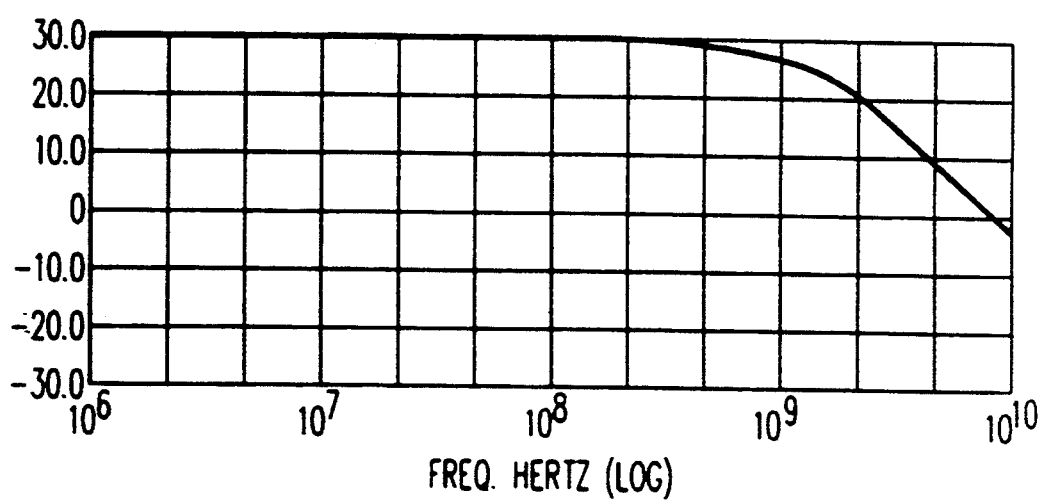
FIG. 8 is a graphical representation of the response of the microwave amplifier.

A computer simulation was run using PSPICE simulations in which the generator resistances 57 were 100 ohms and the load resistance 59 was 200 ohms. Transconductance of the MOSFET devices 39 was 0.3 mhos. The parasitic capacitance 61 of the devices was 0.5 pF and was matched by 0.5 pF neutralization capacitors 63A, 63B. The results of the simulation are illustrated in FIG. 8, which clearly shows that the device can operate into the gigahertz range without tuning inductors. As can be seen, the elimination of the tuning inductors provides a very wide band amplifier.

From the above, it can be seen that complimentary MICROX FETs with capacitive neutralization in accordance with the invention provide efficient, low distortion, and wideband amplification extending well unto the microwave frequency bands. Such devices are much more attractive than the GaAs devices now considered to be the most suitable at these frequencies. By permitting an all silicon design, MICROX technology enables integration of all functions from dc to microwaves, analog and digital on a single chip. Eliminating the interface devices now used to merge GaAs devices, discrete components and silicon ICs, results in simpler, lower cost, more reliable and more efficient electronic designs.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A broadband power amplifier for signals having a frequency up to and into the gigahertz range and higher, comprising:
   a wafer of semiconductor material having an insulating layer spaced from a top surface with an active layer of semiconductor material between said insulating layer and said top surface;
   first and second amplifier devices formed in said active silicon layer, each of said amplifier devices having parasitic capacitance;
   first and second inputs;
   first and second outputs;
   means connecting said first and second amplifier devices in push-pull circuit configuration between said first and second inputs and said first and second outputs; and
   a first neutralization capacitor connected between said first input and said second output, and a second neutralization capacitor connected between said second input and said first output, with each of said first and second neutralizing capacitors having a capacitance approximating the parasitic capacitance of one of said amplifier devices.

2. The amplifier of claim 1 wherein said semiconductor material is a silicon wafer having resistivity of at least 1000 ohm-centimeters and each of said amplifier devices comprises a pair of complimentary MOSFETs formed in the active layer of said silicon wafer.

3. The amplifier of claim 2 including a positive voltage source and a negative voltage source and wherein each pair of complimentary MOSFETs comprises a P-channel MOSFET and an N-MOSFET each having a gate electrode, a drain electrode and a source electrode, and wherein said means connecting said two pair of complimentary MOSFETs in push-pull circuit configuration comprise means connecting the gate electrodes of the P-channel and N-channel MOSFETs of the first pair of complimentary MOSFETs to said first input and the drain electrodes thereof to the first output, means connecting the gate electrodes of the P-channel and N-channel MOSFETs of the first set of complimentary MOSFETs to said first input, and the drain electrode thereof to the first output, means connecting the gate electrode of the P-channel and N-channel MOSFETs of the second pair of complimentary MOSFETs to the second input, and the drain electrodes thereof to the second output, means connecting the source electrodes of the P-channel MOSFETs of said first and second pairs of complimentary electrodes together and to said positive voltage source, and means connecting the source electrodes of the N-channel MOSFETs of the first and second pairs of complimentary MOSFETs together and to said negative voltage source.

4. The amplifier of claim 3 wherein each of said MOSFETs comprises a plurality of cells with each cell having a source region, a gate region, and a drain region with each region extending from a top surface of said silicon wafer through said active layer to said insulating layer, said silicon wafer having grooves extending from a bottom surface to said source regions and lined with vias in contact with said source regions, said vias being connected along said bottom surface by a floating ground plane, said amplifier further including gate electrodes associated with the gate region of each cell and connected by a gate bus, and drain conductors connecting said drain regions of each cell.

5. The amplifier of claim 4 wherein said drain conductors include air bridges extending over, but spaced from, said gate electrodes and the vias contacting the source regions.

6. The amplifier of claim 4 wherein said means connecting the source electrodes of said MOSFETs comprise microstrips on the upper surface of said wafer, said amplifier further including additional grooves extending from said bottom surface to the top surface and additional vias lining said additional grooves and electrically connecting the floating ground plane for a MOSFET to an associated one of the microstrips on said upper surface of said silicon wafer.

* * * * *